United States Patent
Wang et al.

(10) Patent No.: US 12,274,019 B2
(45) Date of Patent: Apr. 8, 2025

(54) BACK PLATE AND ELECTRONIC DEVICE

(71) Applicants: Tyco Electronics AMP Qingdao Ltd, Qingdao (CN); Tyco Electronics (Shanghai) Co., Ltd., Shanghai (CN); TE Connectivity Services GmbH, Schaffhausen (CH)

(72) Inventors: Jinqiang (Jeff) Wang, Qingdao (CN); Zhiqiang (Simon) Li, Shanghai (CN); Guoxiao (Neo) Shen, Shanghai (CN); Jiefeng (Lear) Zhang, Shanghai (CN); Brian Patrick Costello, Scotts Valley, CA (US)

(73) Assignees: TE Connectivity Solutions GmbH, Schaffhausen (CH); Tyco Electronics (Shanghai) Co., Ltd, Shanghai (CN); Tyco Electronics AMP Qingdao Ltd., Qingdao (CN)

( * ) Notice: Subject to any disclaimer, the term of this patent is extended or adjusted under 35 U.S.C. 154(b) by 542 days.

(21) Appl. No.: 17/538,127

(22) Filed: Nov. 30, 2021

(65) Prior Publication Data

US 2022/0174836 A1 Jun. 2, 2022

(30) Foreign Application Priority Data

Dec. 1, 2020 (CN) .......................... 202011385410.4

(51) Int. Cl.
| | |
|---|---|
| *H05K 7/14* | (2006.01) |
| *H01R 12/70* | (2011.01) |
| *H01R 13/62* | (2006.01) |
| *H05K 7/10* | (2006.01) |

(52) U.S. Cl.
CPC ......... *H05K 7/1439* (2013.01); *H05K 7/1417* (2013.01)

(58) Field of Classification Search
CPC ...... H05K 7/1439; H05K 7/1417; H05K 7/10; H05K 7/1438; H05K 7/1452; H05K 7/1007; H05K 1/181; H01R 13/62; H01R 12/7011; H01R 12/716; H01L 23/40; H01L 23/4006; H01L 23/4093; H01L 23/562; G06F 1/183
See application file for complete search history.

(56) References Cited

U.S. PATENT DOCUMENTS

| | | | | |
|---|---|---|---|---|
| 10,455,685 | B1 * | 10/2019 | Klein | .................. H01L 23/4006 |
| 2003/0161119 | A1 * | 8/2003 | Szu | ...................... H01L 23/4093 |
| | | | | 257/E23.086 |
| 2005/0111190 | A1 * | 5/2005 | Wang | .................... H01L 23/367 |
| | | | | 257/E23.102 |
| 2007/0223197 | A1 * | 9/2007 | Xia | ...................... H01L 23/4093 |
| | | | | 257/E23.086 |
| 2022/0131292 | A1 * | 4/2022 | Cheng | ................ H01R 12/7047 |

FOREIGN PATENT DOCUMENTS

JP 2020072236 A * 5/2020

* cited by examiner

*Primary Examiner* — Hoa C Nguyen
*Assistant Examiner* — Amol H Patel
(74) *Attorney, Agent, or Firm* — Barley Snyder (57) ABSTRACT

A back plate configured to support a circuit board includes a body. The body defines a central recess formed into a top surface thereof, and a raised main support column extending from the central recess and adapted to support the circuit board.

22 Claims, 6 Drawing Sheets

BACK PLATE AND ELECTRONIC DEVICE

CROSS-REFERENCE TO RELATED APPLICATIONS

This application claims the benefit of Chinese Patent Application No. 202011385410.4 filed on Dec. 1, 2020 in the China National Intellectual Property Administration, the whole disclosure of which is incorporated herein by reference.

FIELD OF THE INVENTION

Embodiments of the disclosure relate to a back plate and an electronic device comprising the same.

BACKGROUND

In the prior art, the central processing unit (commonly referred to as the CPU) is usually installed on the socket connector of the circuit board in a pressurized manner. In order to ensure reliable electrical contact between the pins on the central processing unit and the socket connector, it is necessary to apply sufficient contact pressure on the central processing unit. The circuit board is usually supported on a back plate, and a pressurizing component is provided on the central processing unit. The pressurizing component is connected to the back plate and configured to apply pressing force to the central processing unit so as to ensure reliable electrical contact between the central processing unit and the socket connector.

Currently, the part of the back plate corresponding to the central area of the socket connector is hollowed out, causing the central area of the socket connector to be unsupported, which will result in that the amount of contact deflection in the central area of the socket connector decrease and the stress of the socket connector is uneven, thus reducing the stability and reliability of the electrical contact between the central area of the socket connector and the central processing unit.

Improved solutions are desired.

SUMMARY

A back plate for a circuit board according to an embodiment of the present disclosure includes a body defining a central recess formed into a top surface thereof. The body further includes a raised main support column extending from the central recess and adapted to support the circuit board.

BRIEF DESCRIPTION OF THE DRAWINGS

The invention will now be described by way of example with reference to the accompanying Figures, of which.

DETAILED DESCRIPTION OF THE EMBODIMENTS

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to one general technical concept of the present disclosure, a back plate configured to support a circuit board is provided. A central recess with bottom is formed on the top surface of the back plate facing the circuit board. A raised main support column configured to support the circuit board is formed on the bottom surface of the central recess of the back plate.

Figure 1:
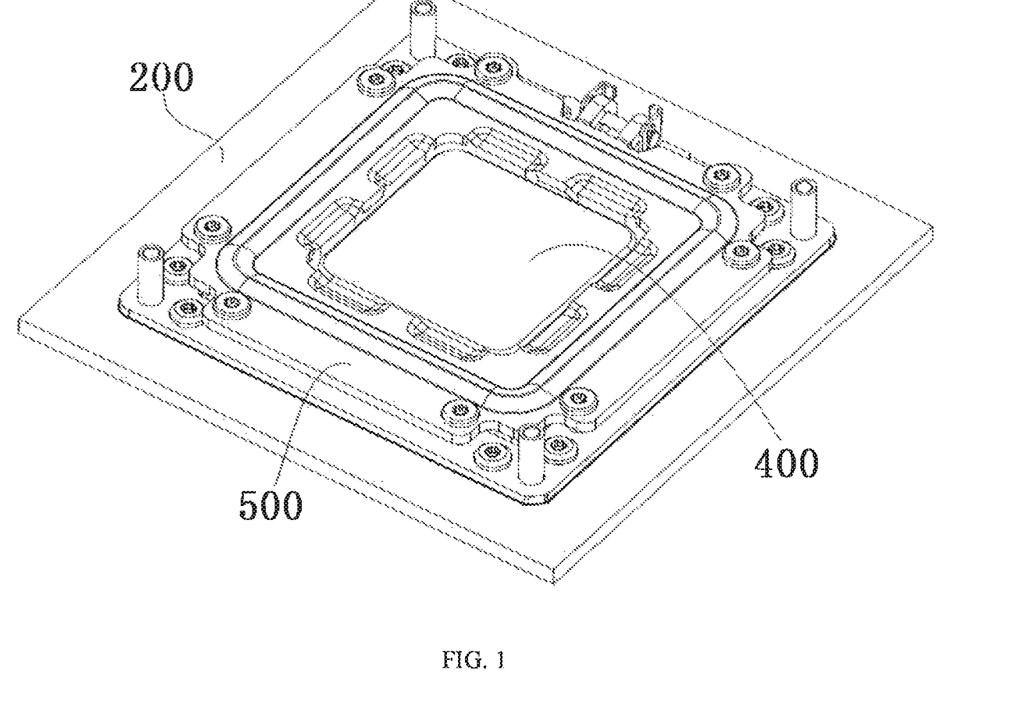
FIG. 1 shows an assembly schematic view of an electronic device according to an exemplary embodiment of the present disclosure.
Figure 2:
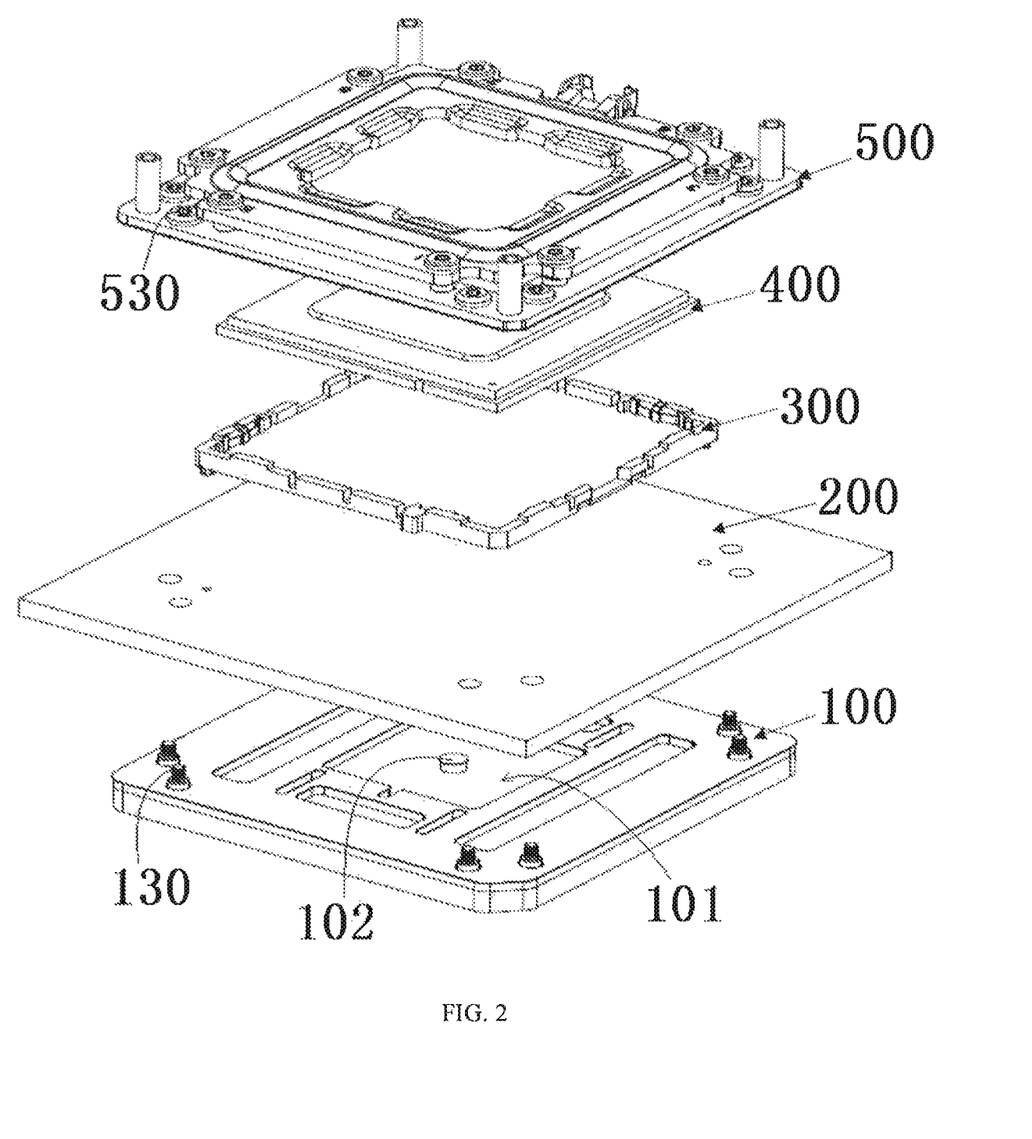
FIG. 2 shows an exploded schematic view of an electronic device according to an exemplary embodiment of the present disclosure.

FIG. 1 shows an assembly schematic view of an electronic device according to an exemplary embodiment of the present disclosure; FIG. 2 shows an exploded schematic view of an electronic device according to an exemplary embodiment of the present disclosure; and FIG. 3 shows a partial cross-sectional view of an electronic device according to an exemplary embodiment of the present disclosure.

Figure 3:
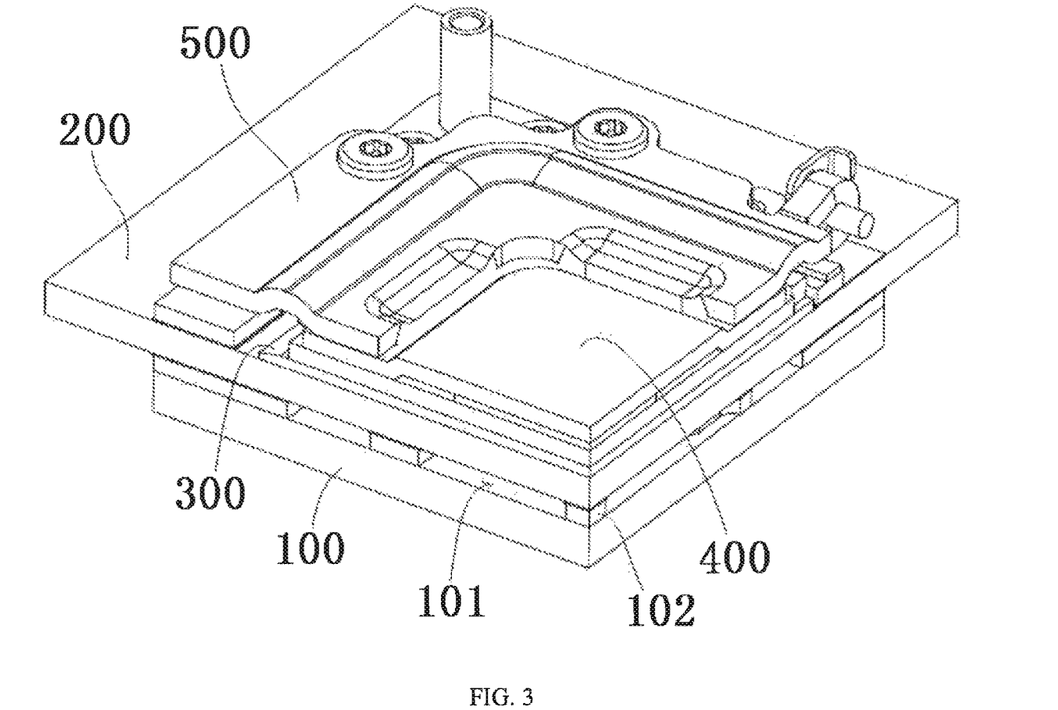
FIG. 3 shows a partial cross-sectional view of an electronic device according to an exemplary embodiment of the present disclosure.

As shown in FIGS. 1 to 3, in the illustrated embodiment, the electronic device mainly comprises: a back plate 100, a circuit board 200, a socket connector 300, an electronic chip 400 and a pressurizing component 500. The circuit board 200 is supported on the top surface of the back plate 100. The socket connector 300 is installed on the top surface of the circuit board 200 (only the housing part of the socket connector 300 is shown in FIG. 2). The electronic chip 400 is adapted to be electrically connected to the circuit board 200 via the socket connector 300. The pressurizing component 500 is connected to the back plate 100 and configured to press the electronic chip 400 on the socket connector 300 so that the electronic chip 400 and the socket connector 300 on the circuit board 200 are in reliable electrical contact.

As shown in FIGS. 1 to 3, in an exemplary embodiment of the present disclosure, the aforementioned electronic chip 400 may be a central processing unit, which is in reliable electrical contact with the socket connector 300 on the circuit board 200 under the action of the pressing force applied by the pressurizing component 500. However, the present disclosure is not limited to this, and the aforementioned electronic chip 400 may also be other chips.

Figure 4:
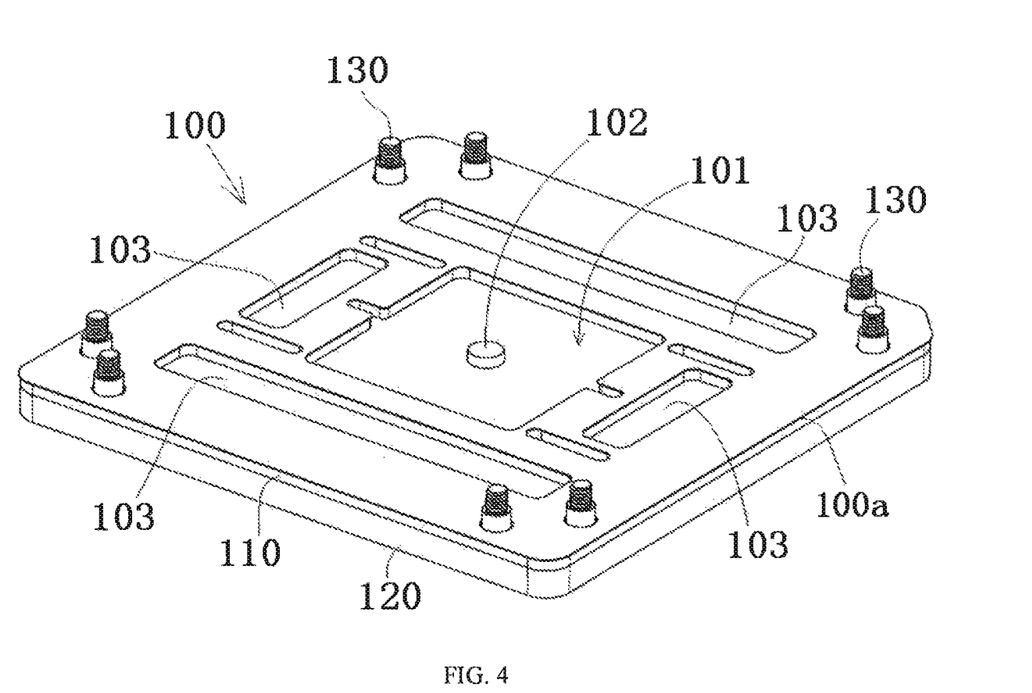
FIG. 4 shows a perspective schematic view of a back plate according to an exemplary embodiment of the present disclosure.

FIG. 4 shows a perspective schematic view of a back plate 100 according to an exemplary embodiment of the present disclosure.

As shown in FIGS. 3 and 4, in the illustrated embodiment, the back plate 100 is configured to support the circuit board 200. A central recess 101 with bottom is formed on the top surface of the back plate 100 facing the bottom surface of the circuit board 200. In other words, the depth of the central recess 101 is less than the thickness of the back plate 100, therefore, the central recess 101 is configured to have a bottom surface and do not penetrate the back plate 100. The central recess 101 is configured to correspond to the central area of the socket connector 300 installed on the top surface of the circuit board 200.

As shown in FIGS. 3 and 4, in the illustrated embodiment, a raised main support column 102 is formed in the center of the bottom surface of the central recess 101 of the back plate 100, and the main support column 102 is configured to support the circuit board 200 to increase the amount of contact deflection in the central area of the socket connector 300 and improve the uniformity of the force of the socket connector 300. In this way, the stability and reliability of the electrical contact between the central area of the socket connector 300 and the electronic chip 400 can be improved.

Although not shown, in another exemplary embodiment of the present disclosure, the main support column 102 may not be located at the center of the bottom surface of the central recess 101. For example, the main support column 102 may also be located at a position offset from the center of the bottom surface of the central recess 101 by a predetermined distance.

However, the structure of the back plate 100 of the present disclosure is not limited to the embodiments shown in FIGS. 3 and 4. For example, FIG. 5 shows a perspective schematic view of a back plate 100 according to another exemplary embodiment of the present disclosure.

Figure 5:
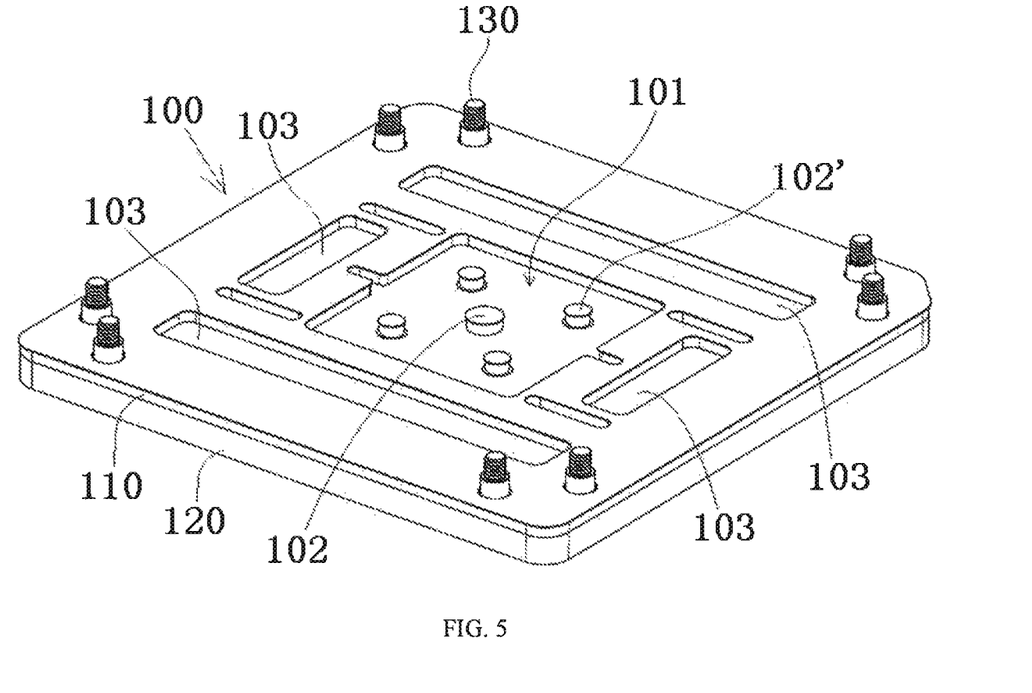
FIG. 5 shows a perspective schematic view of a back plate according to another exemplary embodiment of the present disclosure.

As shown in FIG. 5, in the illustrated embodiment, a plurality of raised additional support columns 102' are also formed on the bottom surface of the central recess 101 of the back plate 100, and the plurality of additional support columns 102' are distributed around the main support column 102 for supporting the circuit board 200 together with the main support column 102 to increase the amount of contact deflection in the central area of the socket connector 300 and improve the uniformity of the force of the socket connector 300.

As shown in FIG. 5, in the illustrated embodiment, a plurality of additional support columns 102' are symmetrically distributed around the main support column 102, which can further improve the uniformity of the force of the socket connector 300. However, the present disclosure is not limited to this, and a plurality of additional support columns 102' can also be distributed around the main support column 102 in an asymmetric manner.

As shown in FIG. 5, in the illustrated embodiment, the top surface of the main support column 102 is flush with the top surfaces of the additional support columns 102', and the top surfaces of the main support column 102 and the additional support columns 102' are flush with the top surface of the back plate 100.

As shown in FIG. 5, in the illustrated embodiment, the number of the additional support columns 102' is not less than three. For example, the number of the additional support columns 102' may be three, four, five, six or more.

As shown in FIG. 5, in the illustrated embodiment, the cross section of the main support column 102 and/or the additional support columns 102' is circular, regular polygon, or other suitable shapes. The cross-sectional area of the main support column 102 is larger than the cross-sectional area of the additional support column 102'. In this way, the uniformity of the force of the socket connector 300 can be further improved.

As shown in FIGS. 4 and 5, in the illustrated embodiment, a plurality of strip-shaped recesses 103 with bottom are also formed on the top surface of the back plate 100, and the plurality of strip-shaped recesses 103 are symmetrically distributed around the central recess 101 and spaced apart from the central recess 101. In this way, the uniformity of the force of the socket connector 300 can be further improved.

As shown in FIGS. 4 and 5, in the illustrated embodiment, the back plate 100 is a combined back plate, and the back plate 100 comprises a substrate 120 and a top plate 110 laminated on the substrate 120. However, the present disclosure is not limited to the illustrated embodiment, and the back plate 100 may also be a single integrated back plate with a predetermined thickness.

As shown in FIGS. 4 and 5, in the illustrated embodiment, the thickness of the top plate 110 is less than the thickness of the substrate 120. The substrate 120 is a solid plate, and the top plate 110 is a hollow plate that is hollowed out. A middle window and a strip-shaped opening are hollowed out on the top plate 110. The middle window is configured to constitute the central recess 101, and the strip-shaped opening is configured to constitute the strip-shaped recess 103. The main support column 102 is formed on the top surface of the substrate 120.

As shown in FIGS. 4 and 5, in the illustrated embodiment, at least one threaded fastener 130 is provided at each corner of the back plate 100, and the threaded fastener 130 is configured to connect a pressurizing component 500 to the back plate 100. The pressurizing component 500 is configured to press an electronic chip 400 on the socket connector 300 and fix the electronic chip 400, the socket connector 300 and the circuit board 200 to the back plate 100.

As shown in FIGS. 4 and 5, in the illustrated embodiment, a layer of back plate insulating film 100a is attached to the top surface of the back plate 100 to electrically isolate the back plate 100 from the circuit board 200.

Figure 6:
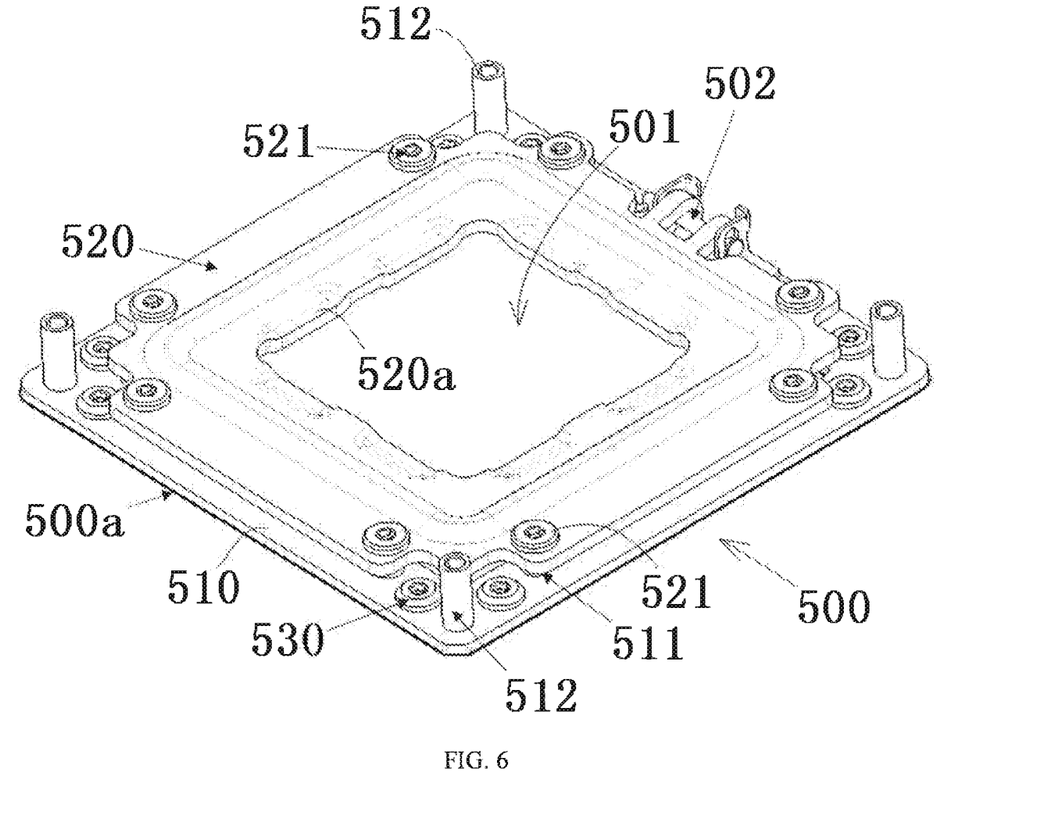
FIG. 6 shows a perspective schematic view of the pressurizing component of the electronic device shown in FIG. 2.

FIG. 6 shows a perspective schematic view of the pressurizing component 500 of the electronic device shown in FIG. 2.

Referring to FIGS. 1-3 and 6, in the illustrated embodiment, the electronic device further comprises a heat sink (not shown). The heat sink is fixed to the top of the pressurizing component 500, and the bottom protrusion of the heat sink is received in the central opening 501 on the pressurizing component 500 so as to be in thermal contact with the electronic chip 400.

Referring to FIGS. 1-3 and 6, in the illustrated embodiment, the pressurizing component 500 comprises a pressurizing bottom plate 510 and a pressurizing top plate 520 fixed on the pressurizing bottom plate 510, and the pressurizing top plate 520 is configured to have an elastic pressing portion 520a adapted to be pressed on the electronic chip 400.

Referring to FIGS. 1-3 and 6, in the illustrated embodiment, nuts 530 adapted to connect with the threaded fasteners 130 on the back plate 100 are provided at each corner of the pressurizing bottom plate 510 to connect and fix the pressurizing component 500 to the back plate 100.

Referring to FIGS. 1-3 and 6, in the illustrated embodiment, cylindrical threaded sleeves 512 adapted to be in threaded connection with screws on the heat sink are provided at each corner of the pressurizing bottom plate 510 to connect and fix the heat sink to the pressurizing component 500.

Referring to FIGS. 1-3 and 6, in the illustrated embodiment, fixing screws 521 are provided on the pressurizing top plate 520, and fixing nuts 511 adapted to be in threaded connection with the fixing screws 521 are provided on the pressurizing bottom plate 510 to fix the pressurizing top plate 520 to the pressurizing bottom plate 510.

Referring to FIGS. 1-3 and 6, in the illustrated embodiment, one side of the pressurizing top plate 520 is rotatably connected to the pressurizing bottom plate 510, so that the pressurizing top plate 520 can be rotatably opened relative to the pressurizing bottom plate 510 after the fixing screw 521 are removed.

Referring to FIGS. 1-3 and 6, in the illustrated embodiment, the pressurizing top plate 520 is rotatably connected to the pressurizing bottom plate 510 via a hinge structure 502. However, the present disclosure is not limited to this, and the pressurizing top plate 520 may also be rotatably connected to the pressurizing bottom plate 510 in other ways, for example, through pin hole fitting.

Referring to FIGS. 1-3 and FIG. 6, in the illustrated embodiment, a layer of insulating film 500a is attached to the bottom surface of the pressurizing component 500 to electrically isolate the pressurizing component 500 from the circuit board 200.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A back plate configured to support a circuit board, comprising
   a body;
   a central recess formed into a top surface of the body;
   a raised main support column extending from the central recess and adapted to support the circuit board; and
   a plurality of additional raised support columns extending from the central recess of the back plate, the plurality of additional support columns being distributed around the main support column.

2. The back plate according to claim 1, wherein a top surface of the main support column is flush with the top surfaces of the additional support columns, and the top surfaces of the main support column and the additional support columns are flush with the top surface of the body.

3. The back plate according to claim 1, wherein the number of the additional support columns is not less than three.

4. The back plate according to claim 1, wherein a cross-sectional area of the main support column is larger than a cross-sectional area of the additional support column.

5. The back plate according to claim 1, wherein a plurality of strip-shaped recesses are defined in the top surface of body.

6. The back plate according to claim 5, wherein the plurality of strip-shaped recesses are symmetrically distributed around the central recess and spaced apart from the central recess.

7. The back plate according to claim 1, wherein the back plate is a single integrated back plate with a predetermined thickness.

8. The back plate of claim 1, wherein the back plate is a combined back plate, including a substrate and a top plate laminated on the substrate, the thickness of the top plate is less than the thickness of the substrate.

9. The back plate according to claim 8, wherein the substrate is a solid plate, and the central recess is hollowed out on the top plate, and the main support column is formed on the top surface of the substrate.

10. The back plate according to claim 1, wherein a layer of back plate insulating film is attached to the top surface of the back plate to electrically isolate the back plate from the circuit board.

11. The back plate according to claim 1, wherein at least one threaded fastener is provided at each corner of the back plate, and the threaded fastener is configured to connect a pressurizing component to the back plate, the pressurizing component is configured to press an electronic chip on the socket connector and fix the electronic chip, the socket connector and the circuit board to the back plate.

12. The back plate according to claim 1, wherein the raised main support column is positioned in the central recess and is spaced apart from a plurality of edges of the central recess.

13. An electronic device, comprising:
   a back plate, including:
      a body;
      a central recess formed into a top surface of the body; and
      a raised main support column extending from the central recess; and
   a circuit board supported on the top surface and main support column of the back plate;
   a socket connector installed on the circuit board;
   an electronic chip adapted to be electrically connected to the circuit board via the socket connector; and
   a pressurizing component connected to the back plate and configured to press the electronic chip on the socket connector, the pressurizing component comprises a pressurizing bottom plate and a pressurizing top plate fixed on the pressurizing bottom plate, the pressurizing top plate adapted to have an elastic pressing portion for pressing on the electronic chip.

14. The electronic device according to claim 13, further comprising a heat sink fixed to the top of the pressurizing component, a bottom protrusion of the heat sink received in a central opening of the pressurizing component and in thermal contact with the electronic chip.

15. The electronic device according to claim 14, wherein cylindrical threaded sleeves adapted to be in threaded connection with screws on the heat sink are provided proximate each corner of the pressurizing bottom plate to connect and fix the heat sink to the pressurizing component.

16. The electronic device according to claim 13, further comprising nuts adapted to connect with the threaded fasteners on the back plate proximate each corner of the pressurizing bottom plate to connect and fix the pressurizing component to the back plate.

17. The electronic device according to claim 13, wherein fixing screws are provided on the pressurizing top plate, and fixing nuts adapted to be in threaded connection with the fixing screws are provided on the pressurizing bottom plate to fix the pressurizing top plate to the pressurizing bottom plate.

18. The electronic device according to claim 17, wherein one side of the pressurizing top plate is rotatably connected to the pressurizing bottom plate, the pressurizing top plate being capable of being rotatably opened relative to the pressurizing bottom plate after the fixing screw are removed.

19. The electronic device according to claim 13, wherein a layer of insulating film is attached to the bottom surface of the pressurizing component to electrically isolate the pressurizing component from the circuit board.

20. A back plate configured to support a circuit board, comprising
  a body;
  a central recess formed into a top surface of the body; and
  a raised main support column extending from the central recess and adapted to support the circuit board, the back plate is a combined back plate, including a substrate and a top plate laminated on the substrate, the thickness of the top plate is less than the thickness of the substrate.

21. The back plate according to claim 20, wherein the substrate is a solid plate, and the central recess is hollowed out on the top plate, and the main support column is formed on the top surface of the substrate.

22. An electronic device, comprising:
  a back plate, including:
    a body;
    a central recess formed into a top surface of the body; and
    a raised main support column extending from the central recess; and
  a circuit board supported on the top surface and main support column of the back plate;
  a socket connector installed on the circuit board;
  an electronic chip adapted to be electrically connected to the circuit board via the socket connector; and
  a pressurizing component connected to the back plate and configured to press the electronic chip on the socket connector, a layer of insulating film is attached to the bottom surface of the pressurizing component to electrically isolate the pressurizing component from the circuit board.

* * * * *